(12) United States Patent
Hayward et al.

(10) Patent No.: US 6,317,345 B1
(45) Date of Patent: *Nov. 13, 2001

(54) POWER SUPPLY DISTRIBUTION SYSTEM EMPLOYING NON-ISOLATED DC/DC CONVERTERS

(75) Inventors: C. Michael Hayward, Harvard; Robert C. Sullivan, Stow; Richard N. Rehlander, Billerica, all of MA (US)

(73) Assignee: Hybricon Corporation, Ayer, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,332

(22) Filed: Feb. 19, 1999

Related U.S. Application Data

(60) Provisional application No. 60/075,475, filed on Feb. 20, 1998.

(51) Int. Cl.$^7$ ...................................................... H02M 7/00
(52) U.S. Cl. ................................................. 363/65; 307/58
(58) Field of Search ................................. 363/65, 69, 71, 363/72, 67; 307/43, 52, 53, 60, 67, 82, 58, 80

(56) References Cited

U.S. PATENT DOCUMENTS

| | | | |
|---|---|---|---|
| 4,698,738 | * 10/1987 | Miller et al. | 363/65 |
| 5,768,117 | * 6/1998 | Takahashi et al. | 363/65 |
| 5,808,453 | 9/1998 | Lee et al. | 323/224 |

* cited by examiner

*Primary Examiner*—Peter S. Wong
*Assistant Examiner*—Gary L. Laxton
(74) *Attorney, Agent, or Firm*—Mills & Onello LLP

(57) ABSTRACT

In a method and apparatus for partitioning and packaging a power generation and distribution system, a plurality of power supply modules are distributed along the length of the backplane such that backplane voltage drops are minimized and such that power supply currents flow essentially orthogonal to the signal connections between the backplane slots. In this manner, signal interference is minimized and the need for bus bars on the backplane are substantially reduced or eliminated.

10 Claims, 5 Drawing Sheets

POWER SUPPLY DISTRIBUTION SYSTEM EMPLOYING NON-ISOLATED DC/DC CONVERTERS

RELATED APPLICATIONS

This application claims the benefit of United States Provisional Application No. 60/075,475, filed Feb. 20, 1998, the contents of which are incorporated herein in their entirety by reference.

BACKGROUND OF THE INVENTION

Contemporary electronic systems utilize electronic backplanes, also referred to as motherboards, that serve as a communication medium for the exchange of electronic signals between a plurality of daughter cards. These same backplanes also serve as a vehicle for providing electrical power to the daughter cards. Power is generated at one or more power supplies and is distributed to the daughter cards via the backplane at a mating set of connectors.

Modern systems utilizing backplane designs such as VME 64 Extension and Compact PCI require a plurality of power supply voltages with application-specific tailoring of power supply current requirements for each of the plurality of power supply voltages. A typical embodiment utilizes one or more free-standing, separately housed power supplies that are mounted within the enclosure and connected to the backplane via bundles of high-current capacity wires. These free-standing power supplies are typically self-contained power supply systems, having their own enclosures. This configuration yields several undesirable performance problems. The power supply enclosure adds to the physical weight, cost, and size of the power supply. This configuration typically includes a cooling fan that must be integrated into the airflow management design of the enclosure further adding cost and addition acoustic noise. Since current drawn from the power supply is application dependent, the current capacity of the power supply often must change with application, necessitating a change in the power supply configuration. As free-standing units, the power supplies are coupled to the backplane via bundles of high-current wires. The size, quantity, and configuration of these wires is application dependent and therefore must be reconfigured according to the application and current capacity thereof. Because the power rating of the power supply is driven by the worst case requirement of any single direct current (DC) voltage, the power supply selected for an application is typically larger than required. These power supplies tend to be available in standard sizes that offer limited choices, for example such that a need for increased current at 5 Volts will result in more current being generated at the other voltages as well, even if not required for the application.

Contemporary system applications demand fault-tolerant operation. This demand drives a need for fault-tolerant, redundant power supplies having current sharing and hot swap capability. A typical embodiment employs filly redundant power supplies, significantly increasing physical space, weight, and cost. Assuming that each unit is a free-standing power supply with multiple output voltages and high-current capacity, a small number, for example 3, power supplies are commonly employed in redundant systems. This requires significantly more power capacity, for example 50%, than a non-redundant system, such that the system will continue to perform with uninterrupted operation if one of the power supplies fails. Battery backup, if required, is expensive and bulky, requiring a separate battery-powered AC generator and associated charging circuit. Power supplies designed to accept battery backup are expensive and require significant additional circuitry for the battery backup system.

Another conventional power supply distribution system employs redundant front-end power supplies that convert alternating current (AC) power to a DC voltage, which is then distributed to redundant DC input power supplies, typically located on the daughter cards to which they are providing power. However, in this configuration the DC-input power supplies consume valuable daughter card space and create electrical noise and heat on the daughter cards. Because each daughter card requires separate DC-input power supplies, the system level cost is significantly increased. Furthermore, redundancy for DC-input power supply fault tolerance requires duplication on each daughter card, greatly increasing cost and occupation of space.

A further embodiment employs redundant front plug-in power supplies that plug into the backplane in a manner similar to a daughter card, typically along side the daughter cards in adjacent slots at one or both ends of the backplane. As each plug-in unit is a power supply with multiple output voltages and consumes valuable daughter card slot space, a small number (typically 2) power supplies are used in redundant systems. This requires significantly more power capacity (typically 100%) than a non-redundant system. Furthermore, the cost, weight, and physical space are significantly higher (typically 100%) for the redundant system.

SUMMARY OF THE INVENTION

The present invention is directed to a method and apparatus for partitioning and packaging a power generation and distribution system in a manner which overcomes the limitations of the prior art.

The present invention provides a means for eliminating the bundles of cables between power supplies and the backplane. This is accomplished by providing a small DC input power supply configured to plug directly into the backplane.

The present invention further provides a means for plugging a plurality of these small DC input power supply modules into the backplane in such a manner that they are distributed along the length of the backplane such that backplane voltage drops are minimized and such that power supply currents flow essentially orthogonal to the signal connections between the backplane slots. This minimizes signal interference and reduces or eliminates the need for bus bars on the backplane.

The present invention further provides a means for built-in redundancy that minimizes excess power supply capacity and cost. This is accomplished by providing a low-cost, non-isolated, current-sharing DC-to-DC converter sub-circuit with a relatively modest power output, for example less than 50 Watts. Each plug-in DC input power supply module may include a plurality of DC-to-DC converter sub-circuits for each output voltage, thereby providing redundancy on each plug-in DC input power supply module. With multiple plug-in DC input power supply modules distributed across the backplane, excess capacity to allow for a single fault requires only one additional DC-to-DC converter sub-circuit for each voltage level.

The present invention further reduces the cost of the individual plug-in DC input power supply modules by utilililzing a common ground connection to the backplane. This common ground connection is effected through individual plug-in DC input power supply modules that plug directly into the backplane without intervening cables. This dramatically reduces the inductance and resistance of backplane connections. This is accomplished by providing a non-isolated, DC-to-DC converter sub-circuit operating at a high switching frequency with a common low-impedance ground connection to the backplane. This permits the DC-to-DC converters to use small, planar inductors in the printed circuit board rather than transformers, significantly reducing cost.

In a first aspect, the present invention is directed to a redundant power supply for a backplane. A plurality of independent voltage converter units are distributed in parallel between a voltage input and a voltage output. The voltage converter units are adapted for maintaining current sharing between multiple units. Means for monitoring the status of each voltage converter unit are included to identify a fault. Means for selectively activating at least one of said multiple units is further included so as to redundantly supply power to the backplane.

In a preferred embodiment, the voltage converter units comprise non-isolated back-end DC-to-DC converters. One or more redundant isolated front ends may be further included for supplying the voltage input to the voltage converter units.

The redundant power supply may be configured in a modular form adapted for removably coupling with a backplane.

In a preferred embodiment, one or more of said modules may be used for a backplane application and a spare empty location is included for hot-swap replacement.

The output voltage of the power supply module may comprise a single voltage output or multiple voltage outputs.

In a second aspect, the present invention is directed to a power supply system for a backplane. At least one isolated front end for generating a intermediate DC voltage is coupled to a backplane having signal traces between a plurality of daughter card connectors. At least one non-isolated back-end voltage converter is coupled to the backplane for converting the intermediate voltage to an output voltage for providing power to the daughter cards. The back-end voltage converters are configured such that current flow between the back-end voltage converters and the daughter card connectors is substantially orthogonal to current flow through the signal traces of the backplane.

In a preferred embodiment, a multiple of the back-end voltage converters are distributed across the backplane. The backplane preferably comprises a card backplane and a power backplane interconnected such that current flow between the back-end voltage converters and the daughter card connectors is substantially orthogonal to current flow through the signal traces of the backplane. The back-end voltage converters preferably utilize high-frequency switching, in turn utilizing printed inductors.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 3:
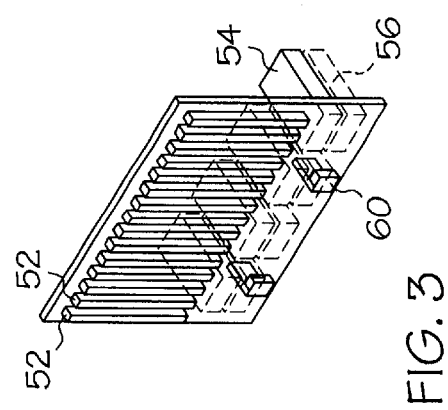
FIGS. 1–6 are perspective views of various embodiments of a backplane in accordance with the present invention.

FIGS. 1–6 are perspective views of various embodiments of the present invention. The monolithic backplane 50 includes a plurality of daughter card connectors 52 arranged in parallel as shown. The daughter card connectors 52 occupy a daughter card portion 55 of the backplane 50. A backplane extension portion 58 supports power supply module connectors 54 aligned from left to right, for example providing a total of four DC power modules. The power modules 54 are coupled to the backplane extension portion 58 via a mating power connector. Below each occupied module position 54 lies an empty, or spare, power connector 56 (shown in dashed lines). If any of the occupied power modules 54 exhibit a failure condition, a new power module may be inserted into the unoccupied connector 56 below the failed power module 54 without interrupting system operation, referred to in the art as a "hot-swap". The failed power module 54 can then be removed during system operation.

The opposite (rear) side of the monolithic backplane 50 includes provisions for power front-end connectors. These connectors are preferably located directly opposite of the power modules 54. For example, two connectors should provide adequate interconnect for this application. The front-end modules preferably consist of standard 48 V, 24 V, or direct AC voltages.

Figure 2:
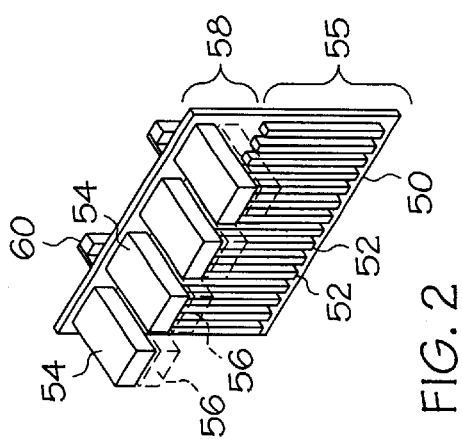

FIG. 2 is a perspective view of an alternative embodiment of the monolithic backplane of the present invention. The perspective view of FIG. 2 shows the monolithic backplane 50 having the extension portion 58 located at the top of the backplane. The DC power modules 54 are located along the top row and the spare power connectors 56 are located beneath the power modules 54. The front-end connectors 60 are visible in this view.

FIG. 3 is a perspective view of an alternative embodiment of the monolithic backplane of the present invention. In this configuration, the power modules 54 and the spare power connectors 56 are located on the rear of the backplane and the front-end connectors 60 are located on the front of the backplane beneath the daughter card connectors 52. This configuration offers the advantage of unopposed air flow for the daughter card modules 52 and the DC power modules.

Figure 4:
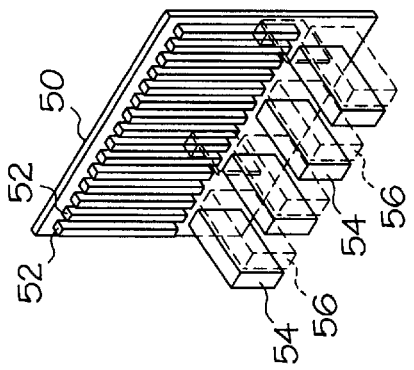

In the configuration of FIG. 4, the power modules 54 are aligned on edge in a single row. Each alternate power connector position is occupied by a power module. This arrangement provides improved air flow over that of FIG. 1, assuming top-to-bottom air flow.

Figure 5:
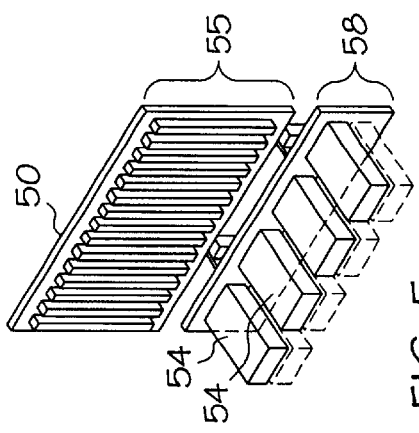
Figure 1:
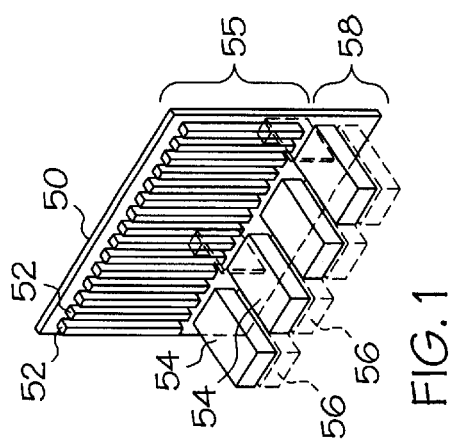

The configuration of FIG. 5 includes a standard backplane 50 that provides the daughter card portion 55. The standard backplane does not include an integral monolithic extension to support the power modules 54. Instead, the power module connectors are positioned on a separate power plane substrate 58. Connections between the power plane 58 and the backplane 50 are preferably provided by cable and/or bus bars in accordance with conventional techniques.

Figure 6:
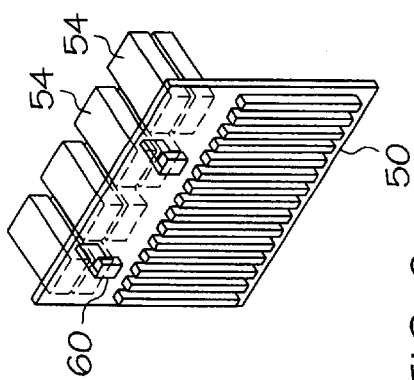

In FIG. 6, the power modules 54 occupy the top portion of the backplane. However, in this configuration, the modules 54 are configured to couple to the rear side of the backplane 50. This offers unopposed air flow for the system modules as described above.

Note that the aforementioned configurations are intended as an illustration and do not in any way limit the possible positions or combination of positions for the various components.

Figure 7:
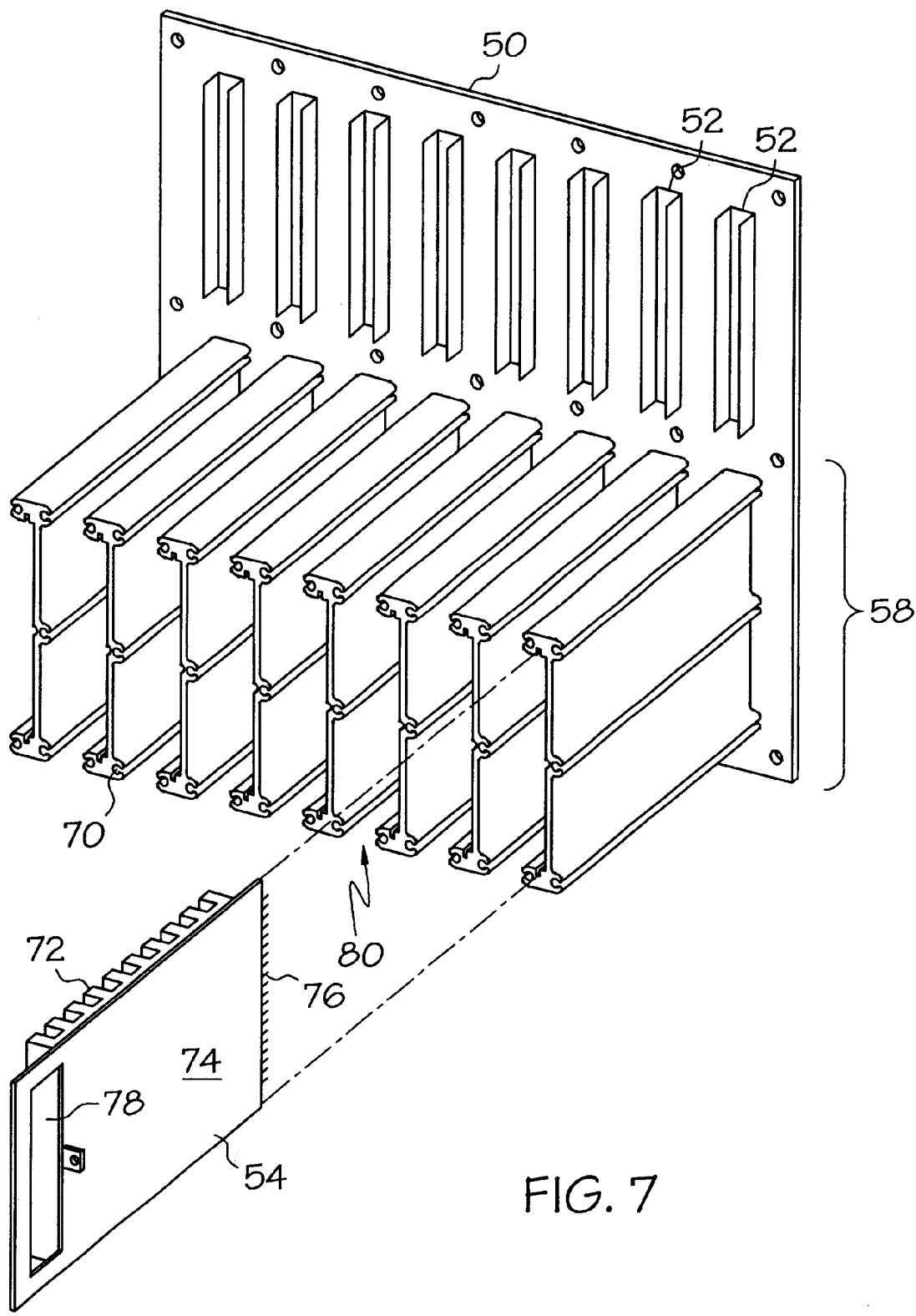
FIG. 7 is a perspective view showing the interface of the power supply modules and backplane.

FIG. 7 is a perspective view of a preferred embodiment of the present invention illustrating the support rail 70 for aligning the DC back-end modules 54 with connectors mounted to the power extension portion 58 of the backplane 50. In this configuration, a plurality of support rails 70 are mounted orthogonally to the power extension portion 58 of the backplane 50 as shown. The support rail 70 form guides for guiding the power modules 54 into proper mating with the backplane connectors. As described above, in alternative configurations, alternate slots 80 may comprise power sleds for occupation by live power modules 54, with the remaining slots 80 being unoccupied to allow for mounting of replacement modules, for example by the hot-swap technique, with the backplane 50 powered-up during module replacement. The power module 54 includes a PC board 74 on which the power supply components are configured. The PC board include a connector 76 for interfacing with the backplane, and a heat sink 72 oriented to maximize air flow as shown. In the embodiment shown, a handle 78 is punched out of the PC board 74 so as to facilitate mounting and dismounting thereof.

Figure 8:
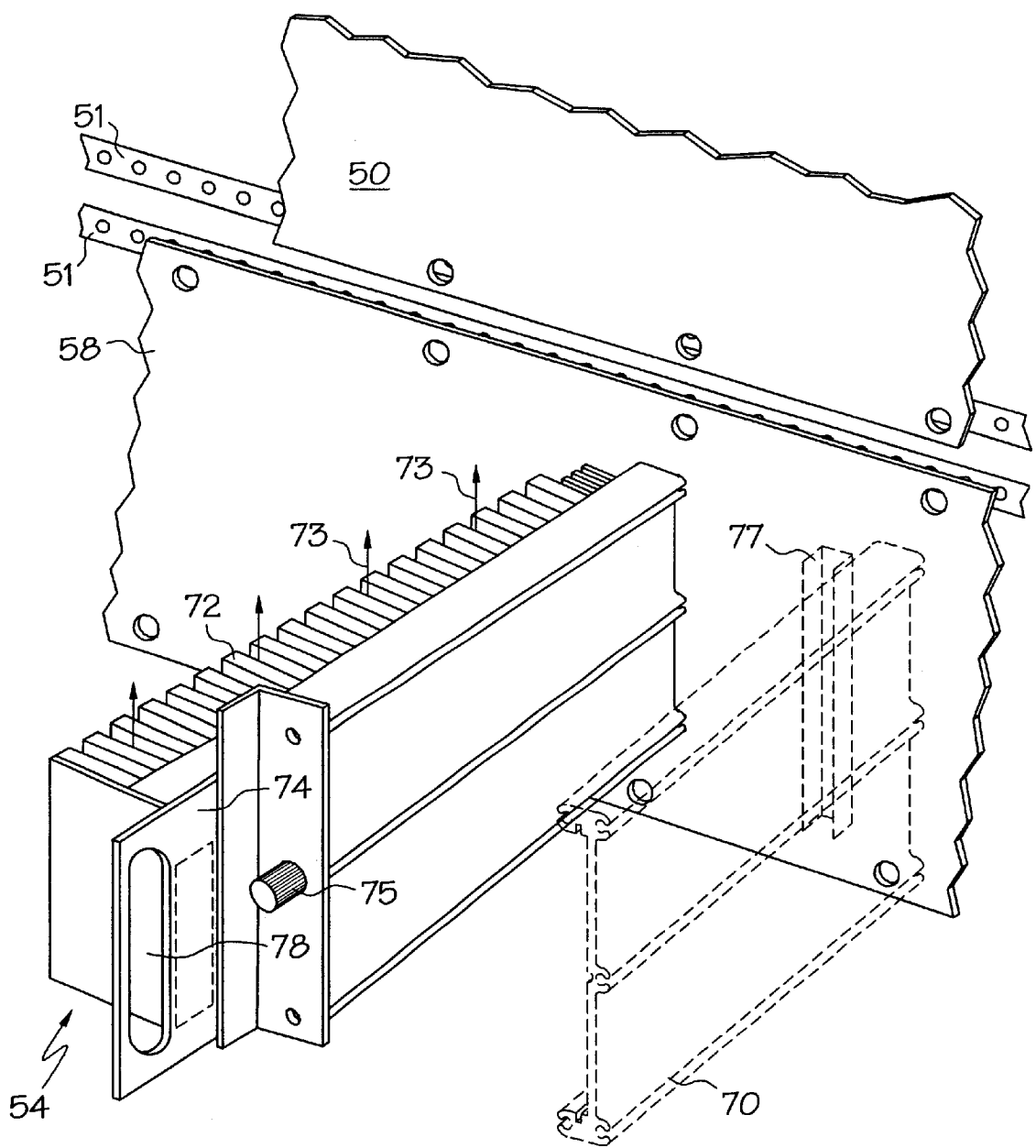
FIG. 8 is a close-up perspective view of a power supply module mounted to a printed circuit power panel configured as a panel separate from the backplane.

FIG. 8 is a close-up perspective view of a power module 54 mounted to a power panel 58 as described above. In this configuration, the power panel 58 is separate from the backplane 50. They are mechanically coupled by extrusion 51 and electrically coupled via a bus bar or cable. The power panel connector 77 may comprise a self-aligning connector. The installed DC power supply unit 54 is fixed in place via retention screw 75. As described above, the heat sink 72 is oriented to maximize air flow 73 therethrough.

Figure 9:
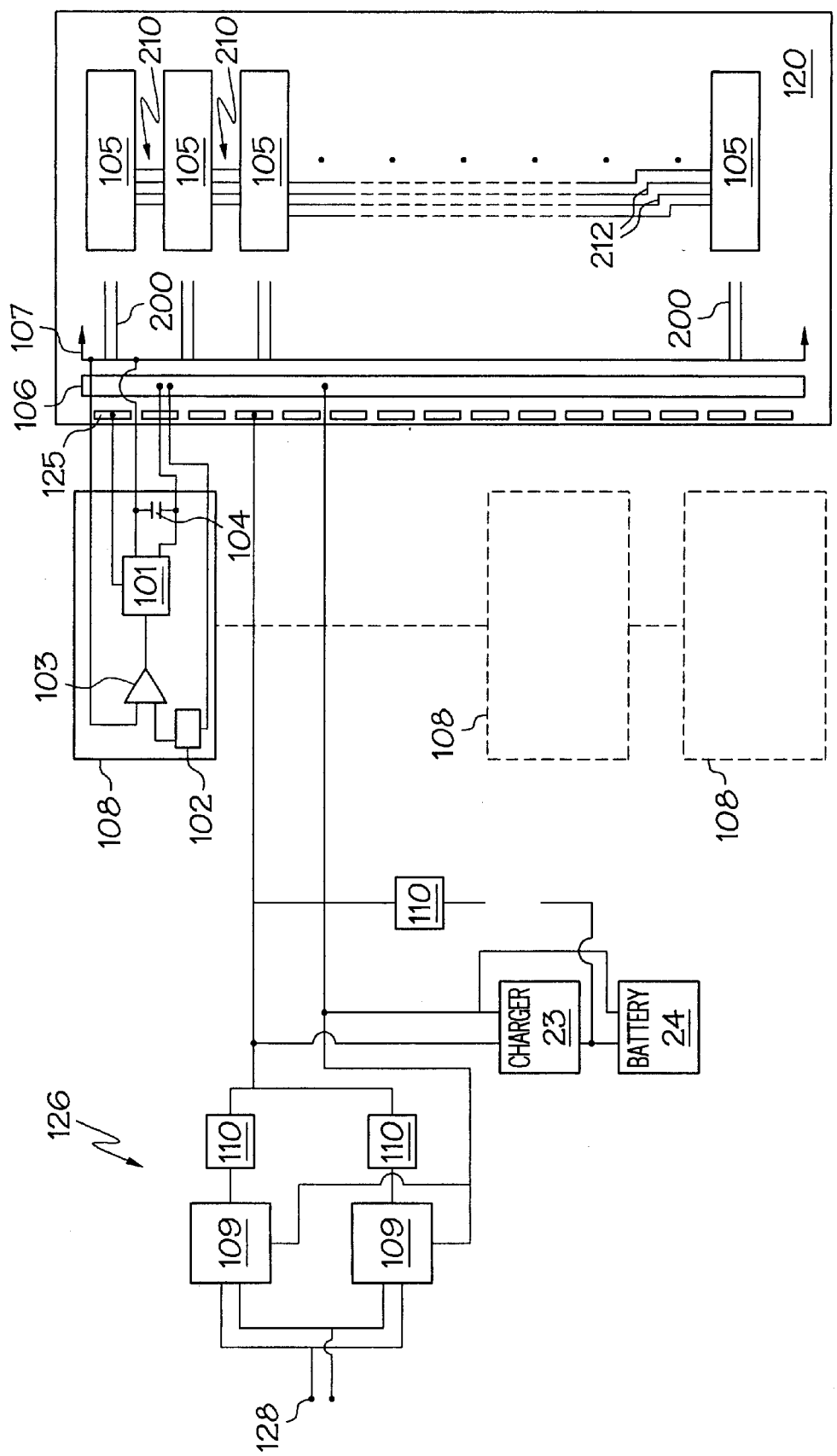
FIG. 9 is a schematic block diagram of the distributing architecture of the present invention.

FIG. 9 is a schematic block diagram illustrating a preferred power supply configuration in accordance with the present invention. Backplane 120 includes a plurality of daughter card connectors 105 interconnected via a plurality of traces 210. The daughter card traces generally run the length of the board and are oriented substantially perpendicular to the connectors as shown. While the traces may have modifications in their paths along the way as shown by jogs 212, they generally are oriented longitudinally with respect to the primary access of the backplane 120.

The backplane further includes a ground plane 106, a daughter card power plane 107 and an intermediate power plane 125. A redundant front-end unit 126 receives an AC input 128 at redundant isolated front-end AC/DC converters 109, preferably, but not necessarily, including power factor correction. In an alternative embodiment, the isolated front-end may comprise DC/DC converters. An OR-ing circuit 110 provides for "dual" or "n+1" current sharing. A battery charge circuit 23 and battery 24 are further provided for battery backup.

The isolated front end 126 preferably provides an intermediate DC voltage at intermediate power plane 125. Back-end converters 108, including switching regulator 101, filter capacitor 104, error amplifier 103 and voltage reference 102 convert the intermediate voltage provided by the intermediate voltage plane 125 to a daughter card output voltage provided to daughter card power plane 107. Power is provided to the plurality of connectors via planes, or traces 200. The power planes or traces 200 are oriented in a direction substantially orthogonal to the signal traces 210 so as to substantially reduce inductive and resistive noise. Additional redundant power modules 108 are optionally included to allow for parallel current sharing, for example a balanced or unbalanced current sharing configuration, for example droop sharing, current limiting sharing, and active current sharing. Means 300 for monitoring the health of each redundant power module are further included for identifying those modules that have failed and for providing feedback of failures to the system and/or user.

In this manner, a single front-end AC/DC converter is shared among a plurality of back-end power modules that plug directly into the backplane, as described above. This configuration enhances the organization of ground current flow such that isolation in each power module is unnecessary.

Figure 10:
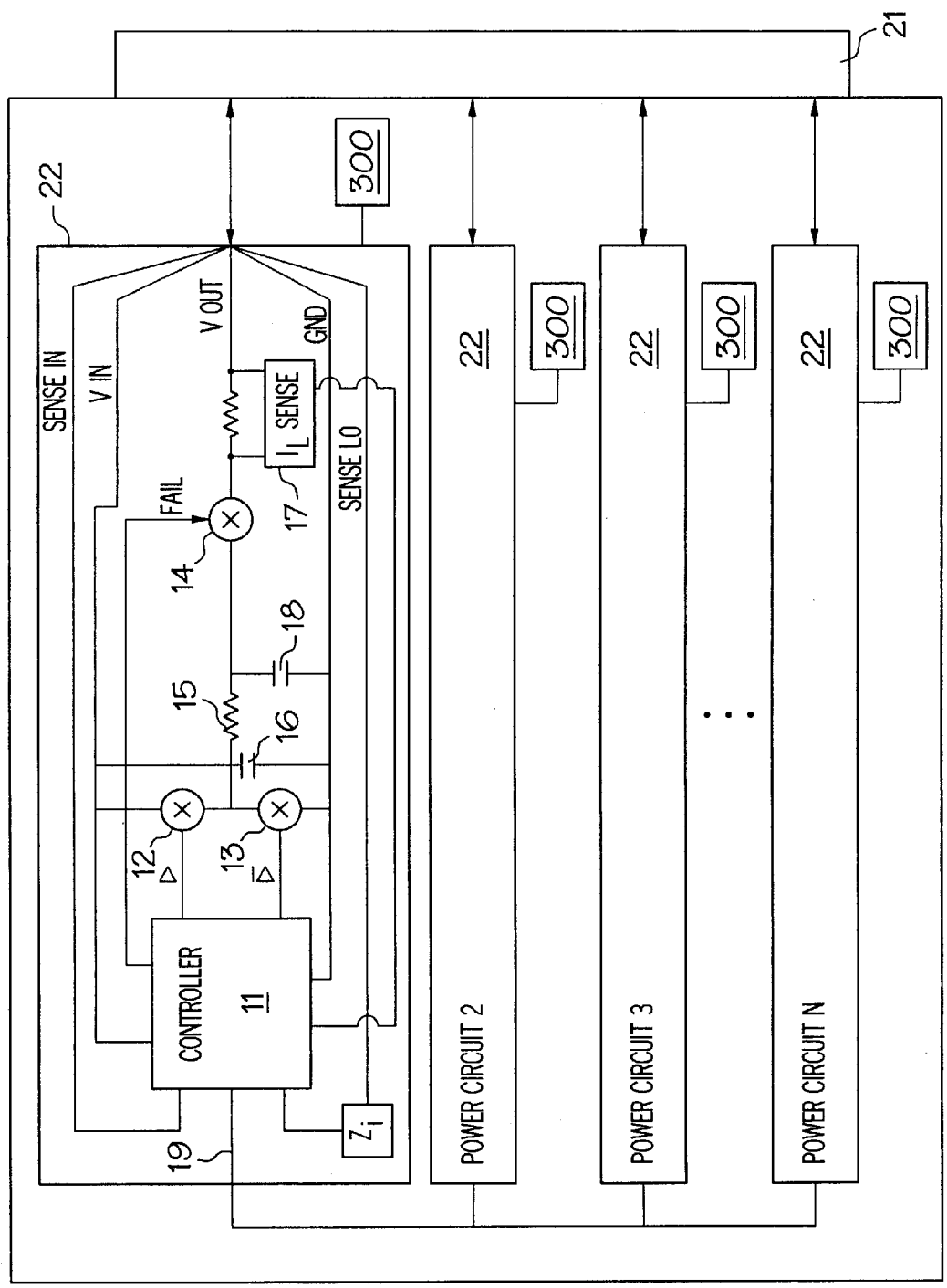
FIG. 10 is a schematic block diagram of a redundant DC-to-DC converter in accordance with the present invention.

Redundancy in the power modules is preferably accomplished within each module 108 as shown in the schematic block diagram of FIG. 10. Each power circuit 22 may comprise a standard DC-to-DC configuration as shown. The module 108 includes a connector 21 for receiving and transmitting power and control signals. The power and control signals are distributed among N power circuits 22. Each power circuit may include a switching regulator controller 11, a current routing switch 12 for switching the output of the regulator connected to drive D, a current routing switch 13 connected to the output of the controller for switching the regulator connected to $\overline{D}$, an input capacitor 16, a storage capacitor 18, and inductor 15, a series switch 14 routing output current to the storage capacitor 18 controlled by a fail drive output from controller 11, and a current sense shunt resistor and detection circuit 17. A current share interconnection line 19 is distributed among the power circuits 1 ... N.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A power supply module for a backplane comprising:
    a plurality of independent voltage converter units distributed in parallel between a voltage input and a voltage output, said voltage converter units maintaining current sharing between multiple units; the voltage converter units each comprising a non-isolated back-end DC-to-DC converter, wherein the voltage input comprises an intermediate DC power source sharing a common return with the voltage output; and
    means for monitoring the status of each voltage converter unit to identify a power supply fault.

2. The power supply module of claim 1 further comprising one or more redundant isolated front end modules for supplying said voltage input to said voltage converter units, wherein the one or more isolated front end modules provides an isolated intermediate voltage power source to said plurality of voltage converter units.

3. The power supply module of claim 1 wherein the plurality of voltage converter units are contained in a single module.

4. A power supply system for a backplane for receiving daughter cards comprising:
    an isolated front end for generating an intermediate DC voltage coupled to a system backplane having signal traces between a plurality of daughter card connectors; and at least one non-isolated back-end voltage converter coupled to said system backplane for convertng said intermediate DC voltage to an output voltage required as a daughter card input voltage by the daughter cards, said at least one back-end voltage converters being configured such that current flow over power traces between the at least one back-end voltage converters and the daughter card connectors is substantially orthogonal to current flow through said signal traces of said system backplane.

5. The system of claim 4 wherein a multiple of said at least one back-end voltage converters are distributed across the system backplane.

6. The system of claim 4 wherein said system backplane comprises a card backplane and a power backplane interconnected such that current flow between the back-end voltage converters and the daughter card connectors is substantially orthogonal to current flow through said signal traces of said system backplane.

7. The system of claim 6 wherein said card backplane and said power backplane comprise a single monolithic backplane.

8. The system of claim 6 wherein said card backplane and said power backplane are separate units.

9. The system of claim 4 comprising a plurality of non-isolated back end voltage converters, and further comprising means for monitoring the status of each voltage converter to identify a fault and means for selectively activating at least one of said voltage converters so as to redundantly supply power to said daughter card connectors.

10. The system of claim 9 wherein the voltage converter units comprise non-isolated back-end DC-to-DC converters.

* * * * *